United States Patent
Liu et al.

(10) Patent No.: US 6,703,315 B2
(45) Date of Patent: Mar. 9, 2004

(54) METHOD OF PROVIDING A SHALLOW TRENCH IN A DEEP-TRENCH DEVICE

(75) Inventors: Wei Liu, Sunnyvale, CA (US); David Mui, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 67 days.

(21) Appl. No.: 10/165,894

(22) Filed: Jun. 10, 2002

(65) Prior Publication Data

US 2002/0151149 A1 Oct. 17, 2002

Related U.S. Application Data

(62) Division of application No. 09/784,997, filed on Feb. 16, 2001, now Pat. No. 6,458,671.

(51) Int. Cl.$^7$ ............................................. H01L 21/302
(52) U.S. Cl. ..................... 438/706; 438/712; 438/720; 438/723
(58) Field of Search ................................ 438/706, 712, 438/720, 723

(56) References Cited

U.S. PATENT DOCUMENTS

| | | | |
|---|---|---|---|
| 5,831,301 A | 11/1998 | Horak et al. ............. | 257/302 |
| 5,990,017 A | * 11/1999 | Collins et al. ........... | 438/714 |
| 6,074,954 A | 6/2000 | Lill et al. ................ | 438/710 |
| 6,281,069 B1 | 8/2001 | Wu et al. ................. | 438/248 |
| 6,297,088 B1 | 10/2001 | King ....................... | 438/243 |
| 6,312,982 B1 | 11/2001 | Takato et al. ............ | 438/238 |
| 6,432,774 B2 | * 8/2002 | Heo et al. ............... | 438/270 |
| 6,458,671 B1 | * 10/2002 | Liu et al. ................ | 138/391 |

OTHER PUBLICATIONS

Meijer et al., "Selective plasma etching for contact holes using fluorine-based chemistry with addition of N2", J. Vac. Sci. Technol. B17(6), Nov./Dec. 1999, 2644–2647.
"Process to Make Self–Aligned Dynamic Random–Access memory Cells", Jan. 1998, IBM TDB NN8801327.
"Process Scheme to Make Shallow Trench Isolation Self-Aligned to the Storage Trench", Mar. 1991, IBM TDB NA9103260.

* cited by examiner

*Primary Examiner*—Nadine G. Norton
*Assistant Examiner*—Lynette T. Umez-Eronini
(74) *Attorney, Agent, or Firm*—Mayer Fortkort and William; Joseph Bach

(57) ABSTRACT

A method of forming a shallow trench within a trench capacitor structure. This method can be used, for example, in the construction of a DRAM device. The method comprises: (1) providing a trench capacitor structure comprising (a) a silicon substrate having an upper and a lower surface; (b) first and second trenches extending from the upper surface into the silicon substrate; (c) first and second oxide regions lining at least portions of the first and second trenches; and (d) first and second polysilicon regions at least partially filling the oxide lined first and second trenches; and (2) forming a shallow trench from an upper surface of the structure, the shallow trench having a substantially flat trench bottom that forms an interface with portions of the silicon substrate, the first oxide region, the second oxide region, the first polysilicon region and the second polysilicon region, the shallow trench being formed by a process comprising (a) a first plasma etching step having an oxide:silicon:polysilicon selectivity of <1:1:1 and (b) a second plasma etching step having an oxide:silicon:polysilicon selectivity of >1:1:1, more preferably >1.3:1:1.

5 Claims, 8 Drawing Sheets

METHOD OF PROVIDING A SHALLOW TRENCH IN A DEEP-TRENCH DEVICE

CROSS-REFERENCE TO RELATED APPLICATION

This Application is a division of U.S. patent applicaion Ser. No. 09/784,997, filed Feb. 16, 2001 entitled "Method Of Providing A Shallow Trench In A Deep-Trench Device now U.S. Pat. No. 6,458,671."

BACKGROUND OF THE INVENTION

1. Field of the Invention

The present invention relates to methods of providing a shallow trench in a deep-trench device.

2. Brief Description of the Background Art

Isolation of deep-trench capacitors by means of a shallow isolation trench is a well-known step in the formation of semiconductor devices, and in particular dynamic random access memory (DRAM) devices.

FIGS. 1A–1C illustrate a prior art procedure for trench capacitor isolation. Turning to FIG. 1A, a trench capacitor structure is illustrated, which includes a silicon wafer 110 having trenches that are lined with an oxide layer 114, such as a silicon oxide layer or an ONO layer, and are filled with doped polysilicon regions 116. Portions of the upper surface of the silicon wafer 110 are provided with pad oxide regions 118, upon which silicon nitride regions 120 (which previously acted as a part of the trench masks) are disposed. An anti-reflective coating 122 is provided over this structure, which is in turn covered with a patterned photoresist masking layer 124.

Using photoresist masking portions 124 as a trench mask, trench isolation is initiated by anisotropically etching through the anti-reflective coating 122 and through the nitride regions 120 to reveal portions of the silicon wafer 110 and the polysilicon regions 116. The resulting structure is shown in FIG. 1B.

Subsequently, the structure is etched until the oxide layer 114 lining the trenches is reached. To achieve a substantially flat trench bottom, as exemplified in FIG. 1C, a plasma source gas, such as $CF_4/CHF_3/Cl_2$, is selected that will provide approximately 1:1:1 silicon:polysilicon:oxide selectivity and adequate passivation. A trench with a flat bottom is desirable, for example, to prevent shorting upon the deposition of further layers, for example, in the course of DRAM production. Unfortunately, such 1:1:1 selectivity is, in practice, difficult to achieve, particularly if one wishes to concurrently have control over the etch profile within the isolation trench.

SUMMARY OF THE INVENTION

The above and other difficulties of the prior art are overcome by the present invention.

According to a first embodiment of the present invention, a method of forming a shallow trench within a trench capacitor structure is provided. This method can be used, for example, in the construction of a DRAM device. The method comprises: (1) providing a trench capacitor structure comprising (a) a silicon substrate having an upper and a lower surface; (b) first and second trenches extending from the upper surface into the silicon substrate; (c) first and second oxide regions lining at least portions of the first and second trenches; and (d) first and second polysilicon regions at least partially filling the oxide lined first and second trenches; and (2) forming a shallow trench from an upper surface of the structure, the shallow trench having a substantially flat trench bottom that forms an interface with portions of the silicon substrate, the first oxide region, the second oxide region, the first polysilicon region and the second polysilicon region, the shallow trench being formed by a process comprising (a) a first plasma etching step having an oxide:silicon:polysilicon selectivity of <1:1:1 and (b) a second plasma etching step having an oxide:silicon:polysilicon selectivity of >1:1:1, more preferably >1.3:1:1.

Preferably, the first and second plasma etching steps are conducted using plasma source gases that comprise halogen-atom-comprising species and are conducted within a decoupled plasma source etching system.

The first plasma etching step is preferably conducted using a plasma source gas that comprises at least one halogen containing species selected from $CF_4$, $CHF_3$, HBr and $Cl_2$. For example, the first plasma etching step can be conducted using a plasma source gas that comprises $Cl_2$, HBr and $O_2$, more preferably 10 to 20% $Cl_2$, 70 to 88% HBr, and 2 to 6% $O_2$. As another example, the first plasma etching step can be conducted using a plasma source gas that comprises $CHF_3$, $CF_4$ and $Cl_2$, more preferably 45 to 75% $CHF_3$, 15 to 35% $CF_4$, and 10 to 25% $Cl_2$.

The second plasma etching step is preferably conducted using a plasma source gas that comprises a noble gas and a halocarbon, with preferred halocarbons being of the formula $C_xX_yH_z$, where X is a fluorine atom, x is an integer of 1 to 2, y is an integer of 1 or more, and z is an integer of 0 or more. For example, the second plasma etching step can be conducted using a plasma source gas that comprises $CF_4$ and Ar, more preferably 30 to 50% $CF_4$ and 50 to 70% Ar. In some cases, the plasma source gas further comprises $CHF_3$.

Typically, within this first embodiment of the present invention, the first plasma etching step will result in protrusions along the trench bottom at the interfaces with the first and second oxide regions, with the protrusions being from 50 to 300 Angstroms in height.

In another embodiment, the first plasma etching step has a oxide:silicon:polysilicon selectivity of >1:1:1 and the second plasma etching step has an oxide:silicon:polysilicon selectivity of <1:1:1. This typically results in depressions along the trench bottom at the interfaces with the first and second oxide regions, the depressions being from 50 to 300 Angstroms in depth.

An advantage of the present invention is that a process is provided which provides a shallow trench, which can function as an isolation trench, with a substantially flat trench bottom, while at the same time providing greater flexibility with respect to etch profile than prior processes.

The above and other embodiments and advantages of the present invention will become immediately apparent to those of ordinary skill in the art upon reading the detailed description and claims to follow.

DETAILED DESCRIPTION OF PREFERRED EMBODIMENTS OF THE INVENTION

As a preface to the detailed description, it should be noted that, as used in this specification and the appended claims, the singular forms "a", "an" and "the" include plural referents, unless the context clearly dictates otherwise. All percentages (%) listed for gas constituents are % by volume, unless otherwise indicated.

The term "selectivity" is used to refer to a) a ratio of etch rates of two or more materials; and b) a condition achieved during etch when etch rate of one material is increased in comparison with another material.

Figure 2:
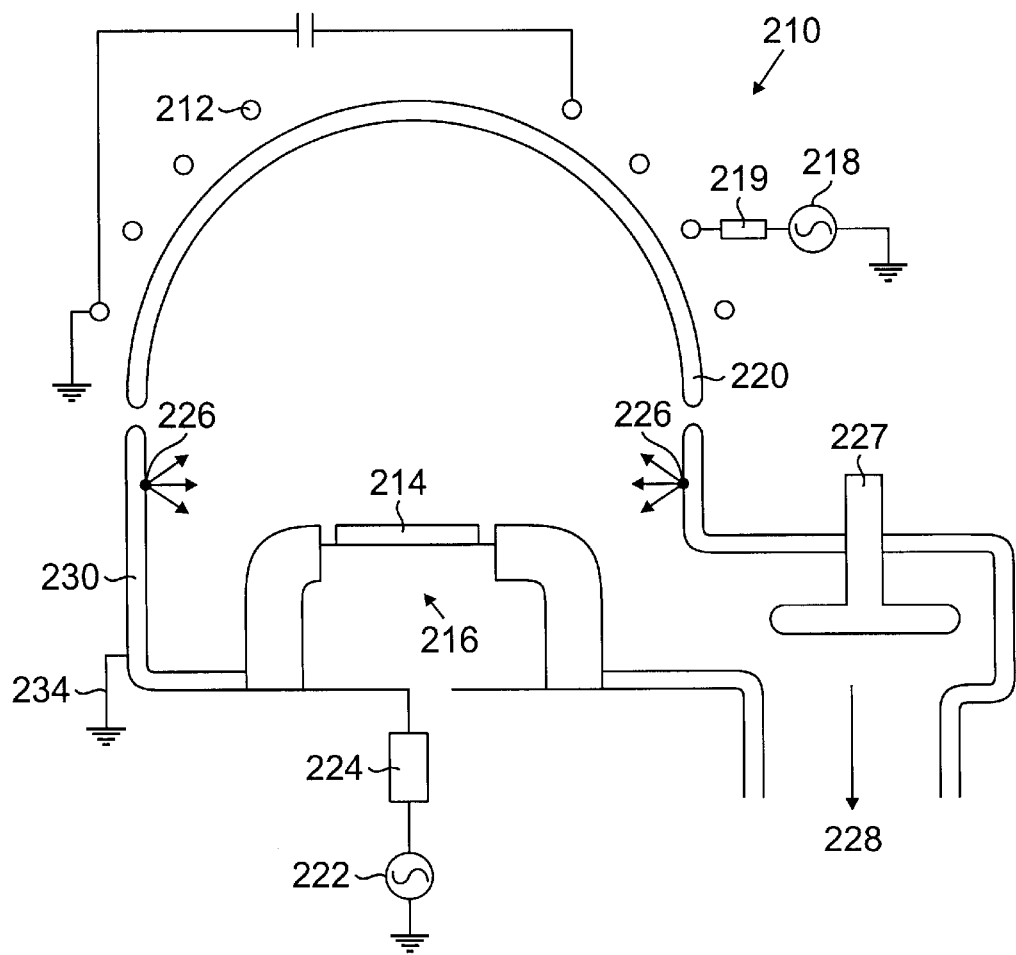
FIG. 2 is a schematic diagram of an exemplary etching system that may be used in connection with embodiments of the invention.

In preferred embodiments of the present invention, etching is carried out in a DPS (decoupled plasma source) etching system. However, it should be appreciated that other dry etch systems may be used. A schematic diagram of one such system, which is also disclosed in U.S. Pat. No. 6,074,954, the entire disclosure of which is incorporated by reference, is found in FIG. 2. This Figure illustrates an etching process chamber 210, which is constructed to include at least one inductive coil antenna segment 212, positioned exterior to a dielectric, shaped ceiling 220, and connected to a radio frequency (RF) power generator 218 (which may be a source power generator with a frequency tunable around 12.56 MHz for impedance matching at different plasma conditions, or which may be a source power generator of fixed frequently which is connected through an impedance matching network 219). Process chamber 210 also includes a substrate 214 on a support pedestal (cathode) 216, which is connected to an RF frequency power generator 222 (bias power generator at a fixed frequency ranging between about 400 kHz and 13.56 MHz) through an impedance matching network 224, and a conductive chamber wall 230, which serves as the electrical ground 234.

The semiconductor substrate 214 is placed on the support pedestal 216 and gaseous components are fed into the process chamber through entry ports 226. A plasma is ignited in process chamber 210 by applying RF powers 218 and 222. Pressure within the etch process chamber 210 is controlled using a vacuum pump (not shown) and a throttle valve 227 situated between process chamber 210 and the vacuum pump. The temperature on the surface of the etch chamber walls is controlled using liquid-containing conduits (not shown), which are located in the walls of the etch chamber 210. The temperature of the semiconductor substrate is controlled by stabilizing the temperature of the support pedestal and flowing helium gas in the channels formed by the back of the substrate and grooves (not shown) on the pedestal 216 surface. The helium gas is used to facilitate heat transfer between the substrate and the pedestal. During the etch process, the substrate surface is gradually heated by the plasma to a steady state temperature which is approximately 5 to 30° C. higher than the substrate support pedestal temperature, depending on the process conditions. Substrate support pedestal (cathode) temperatures preferably range from 10–50° C., more preferably 20–35° C. The surfaces of the etching chamber 210 walls are typically maintained at about 50° (to prevent unwanted deposition), using the cooling conduits previously described.

The RF power applied to the inductive coil antenna segment 212 (source power) and to the substrate pedestal 216 (bias power) may be selected to range from about 50 kHz to as high as 13.56 MHz, with a frequency of 13.5 MHz being preferred for the source power and 12.5 MHz being preferred for the bias power. Wattages can range from a few hundred watts to several thousand watts. The power applied to the substrate pedestal 216 may also be DC.

One particularly preferred plasma processing chamber for carrying out the present invention is a Silicon DPS Chamber available from Applied Materials, Inc. of Santa Clara, Calif. This plasma processing chamber enables the processing of an 8 inch (200 mm) diameter silicon substrate surface.

A procedure for providing trench isolation, according to an embodiment of the invention, will now be discussed in connection with FIGS. 3A through 3D.

Figure 1A:
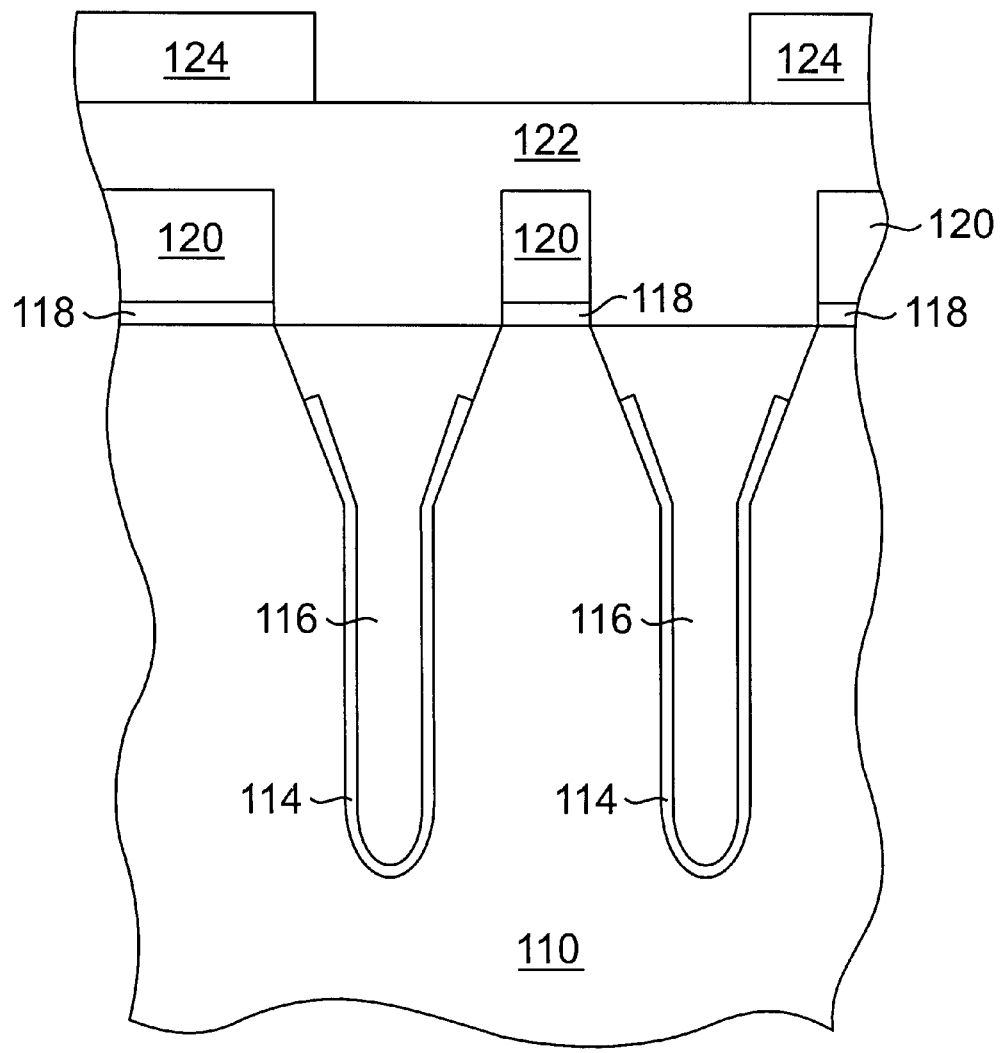
FIGS. 1A through 1C are schematic partial cross-sectional views illustrating a method of forming an isolation trench between two trench capacitors, in accordance with the prior art.
Figure 1B:
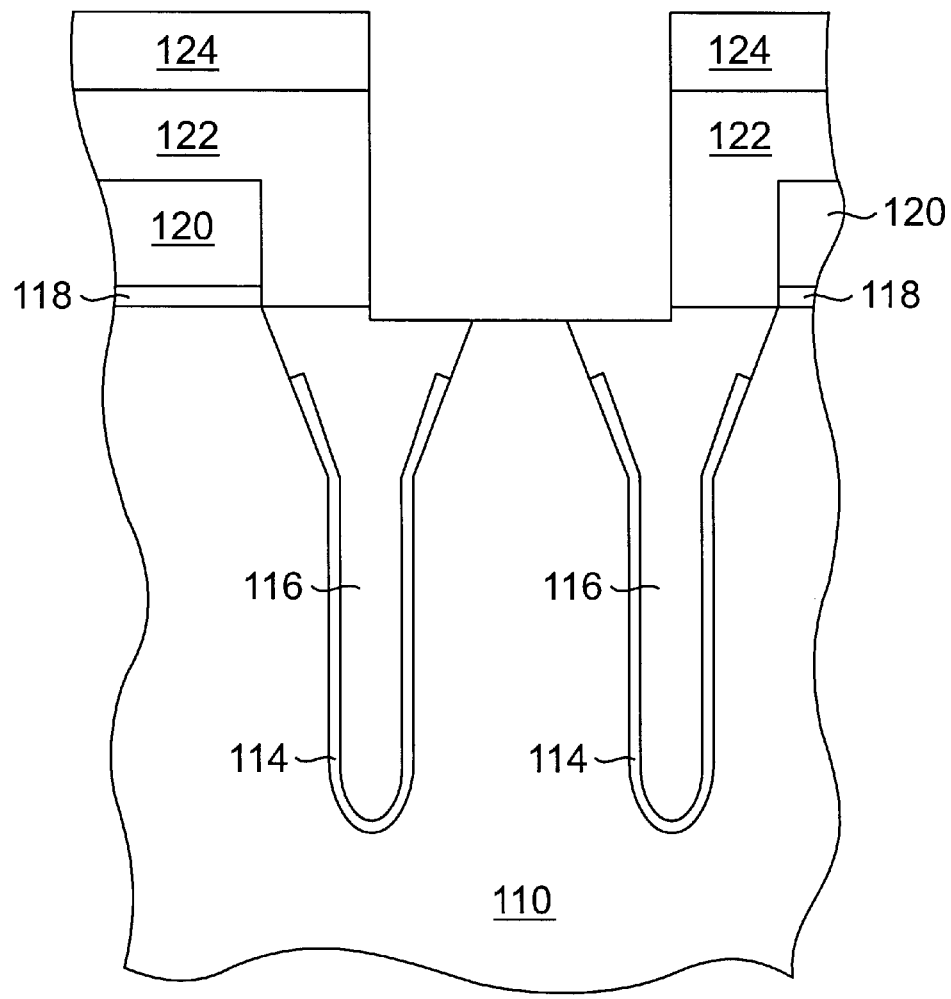
Figure 1C:
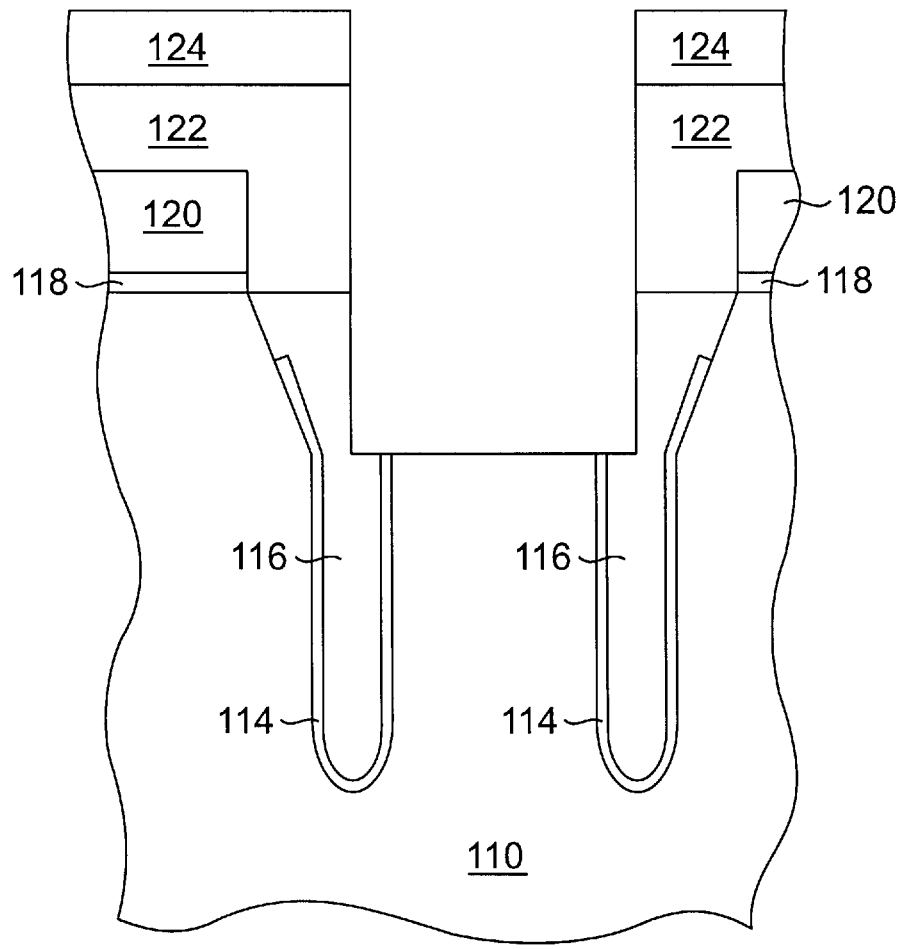
Figure 3A:
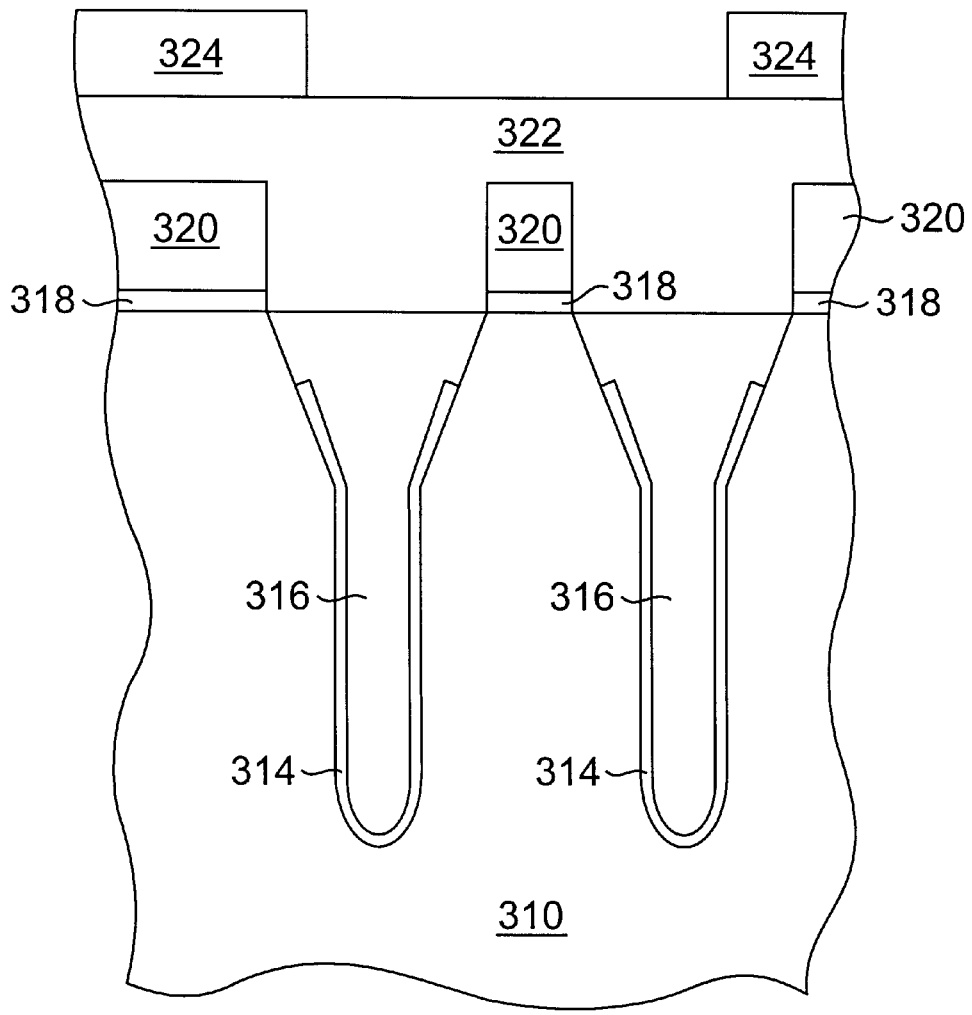
FIGS. 3A through 3D are schematic partial cross-sectional views illustrating a method of forming an isolation trench between two trench capacitors, in accordance with an embodiment of the present invention.

A typical trench capacitor structure that is appropriate for the practice of the present invention is shown in FIG. 3A (which is like the structure shown in FIG. 1A). Techniques for forming a structure like that of FIG. 3A are well known in the art, and any such known technique can be used in connection with the present invention. This structure includes a silicon wafer 310 having trenches that are lined with an oxide layer 314, such as silicon oxide or ONO, and are filled with doped polysilicon regions 316. The structure also includes pad oxide regions 318, silicon nitride regions 320, an anti-reflective coating 322, and a patterned photoresist masking layer 324.

Using photoresist regions 324 as a trench mask, trench isolation is initiated by anisotropically etching the structure, first through the anti-reflective coating 322 and then through the silicon nitride regions 320. The specific etching technique chosen preferably provides a relatively flat trench bottom and exhibits adequate resist selectivity. The resulting structure is shown in FIG. 3B.

Any known etching technique appropriate for this purpose can be used. According to one specific technique, the antireflective coating (e.g., a standard antireflective material such as APEX DUV30 available from Shipley) and nitride regions are first etched through the photoresist regions (e.g., APEX DUV25 from Shipley) using a plasma source gas composed of $CHF_3/CF_4/O_2/Ar$. For example, desirable results can be obtained by operating a DPS etching system such as that described above within the flowing parameters: $CHF_3$ flow rate: 40–60 sccm (standard cubic centimeters per minute), $CF_4$ flow rate: 70–110 sccm, $O_2$ flow rate: 4–6 sccm, Ar flow rate: 40–60 sccm, pressure: 10–20 mT, source power: 400–600W, bias power: 150–200 W. Some exemplary flow ratios are $CF_4/CHF_3$ 1.8:1, $CF_4/Ar$ 1.8:1, and $CF_4/O_2$ 18:1. To ensure that the nitride regions are completely eliminated in the trench, an over-etch step is subsequently preferably performed using the same plasma source gases. Preferred parameters for this over-etch step are as follows: $CHF_3$ flow rate: 70–110 sccm, $CF_4$ flow rate: 40–60 sccm, $O_2$ flow rate: 4–6 sccm, Ar flow rate: 40–60 sccm, pressure: 10–20 mT, source power: 400–600W, bias power: 150–200 W. Some exemplary flow ratios are $CHF_3/CF_4$ 1.8:1, $CHF_3/Ar$ 1.8:1, and $CHF_3/O_2$ 18:1.

Figure 3B:
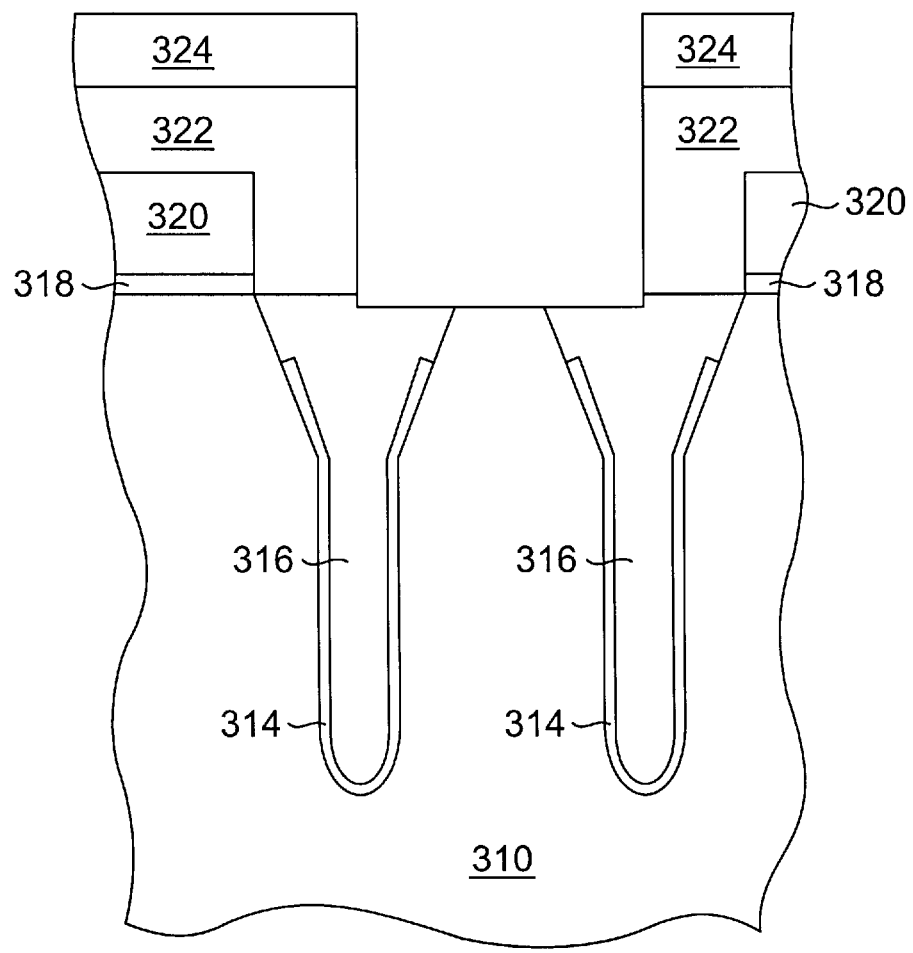
Figure 3C:
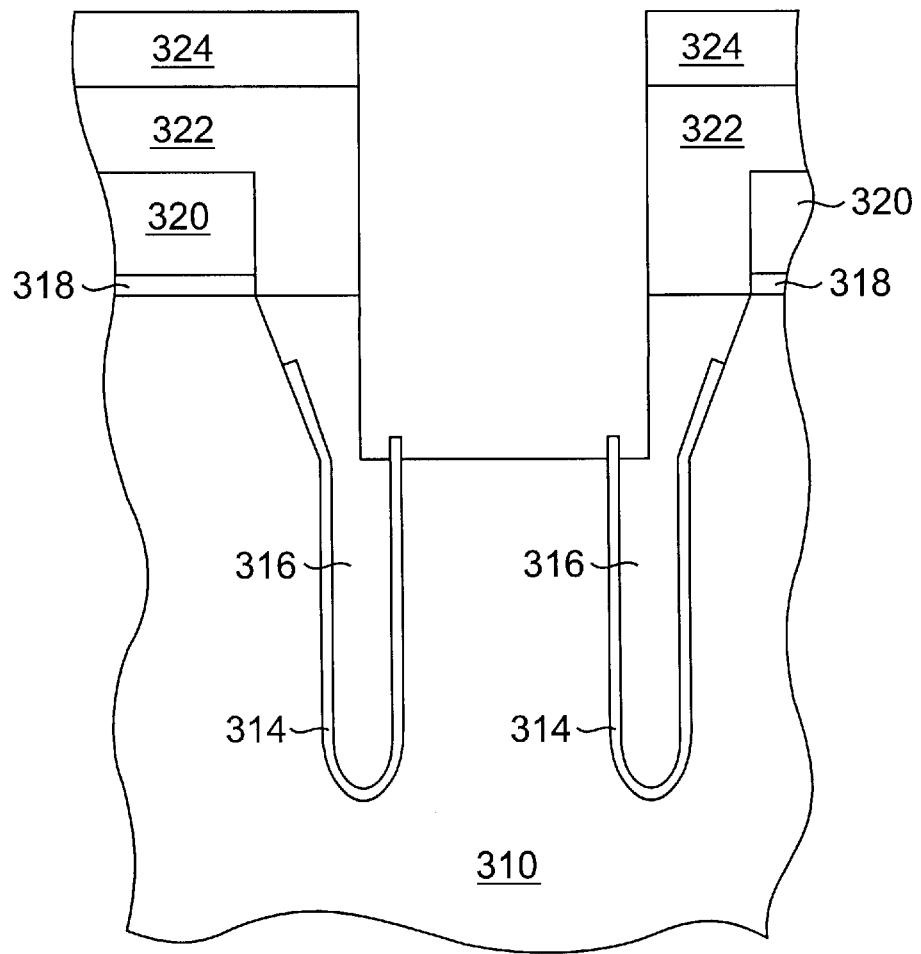

In accordance with an embodiment of the present invention, the trench of FIG. 3B is then etched down to oxide regions 314 in a first trench isolation step, resulting in the structure illustrated in FIG. 3C. This first trench isolation step preferably produces a trench with an etch profile that includes an acceptable sidewall taper (e.g., 85–90°) as well as a trench bottom that is substantially flat, except for the oxide regions 314 protruding from the same. Typically, the oxide regions protrude above the trench bottom by a distance that is on the order of 300 Angstroms or less.

The plasma source gas for this step is selected to etch silicon, polysilicon and oxide. In the embodiment shown, the plasma source gas provides a silicon:polysilicon:oxide etching selectivity of 1:1:<1, preferentially etching the silicon/polysilicon. (Note that silicon:polysilicon selectivity is typically very near 1:1, due to the chemical similarity of the same. Deviations can occur, however, at high doping levels.)

Preferred plasma source gases for this etching step are those that comprise halogen-comprising etchant gases, such as fluorine-comprising gases, chlorine-comprising gases and/or bromine-comprising gases, with fluorine-comprising gases and chlorine-comprising gases being more preferred. Additional species, such as oxygen-comprising species, hydrocarbon-comprising species and/or bromine-comprising species (bromine is effective both as an etching species and as a passivating species) are also preferably provided for passivation, which contributes to the anisotropic quality of the etching process. To avoid undue resist erosion, the selected plasma source gas also preferably exhibits good resist selectivity. For example, the plasma source gas may comprise $CF_4$, $CHF_3$, $Cl_2$, HBr, $O_2$ or a combination thereof as etching species and/or as passivating species.

Depending on the circumstances, a noble gas such as helium or argon (note: argon can also enhance the anisotropic etch and can lower selectivity) can also be provided as a constituent of the plasma source gas to dilute the reactive species. Such noble gases can be added, for example, to retard the etching reaction overall. In this connection, it is noted that any percentages set forth herein are based on the sum of the source gases which produce reactant species and do not include diluent gases which may be used in any quantity which is beneficial, depending on the apparatus used and the process conditions in general. One skilled in the art can determine with minimal experimentation a proper amount of a diluent gas that should be used.

In one preferred embodiment, a plasma source gas containing $Cl_2$, HBr and $O_2$ is used. Without wishing to be bound by theory, it is believed that the $Cl_2$ component provides etchant capability to the plasma gas due to the presence of halogen atoms in the same. At the same time, the $O_2$ provides passivation capability, and the HBr provides both etchant and passivation capability. As a specific example, desirable results can be obtained by operating a DPS etching system such as that described above within the following parameters: $Cl_2$ flow rate: 20–50 sccm, HBr flow rate: 120–240 sccm, $O_2$ flow rate: 5–15 sccm, pressure: 20–50 mT, source power: 800–1600 W, bias power: 150–350 W.

In another preferred embodiment, a plasma source gas containing $CF_4$, $CHF_3$, and $Cl_2$ is provided. Without wishing to be bound by theory, it is believed that the $CF_4$, $CHF_3$ and $Cl_2$ components provide etchant capability to the plasma gas, while the $CHF_3$ further provides passivation due to the hydrocarbon content thereof. The mixture of $CF_4$ and $CHF_3$ facilitates the etching of oxide, but the silicon etch rate is suppressed by these species. Thus, $Cl_2$ is added to enhance the silicon etch rate. As a specific example, desirable results can be obtained by operating a DPS etching system such as that described above within the following parameters: $Cl_2$ flow rate: 15–45 sccm, $CF_4$ flow rate: 20–60 sccm, $CHF_3$ flow rate: 50–150 sccm, pressure: 3–10 mT, source power: 400–800 W, bias power: 40–120 W. Some exemplary flow ratios are $CF_4/CHF_3$ 0.4:1 and $Cl_2/CHF_3$ 0.3:1.

Figure 3D:
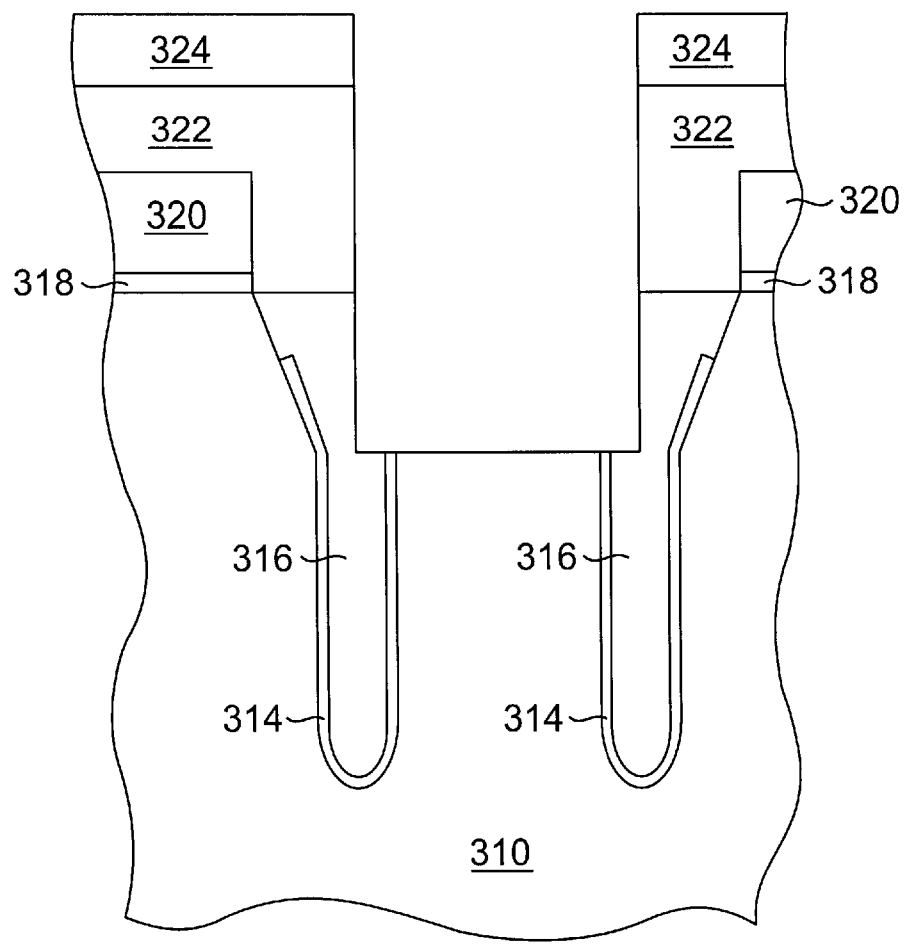

Upon completion of the first trench isolation step, the structure of FIG. 3C is preferably subjected to a second trench isolation step to create a substantially flat trench bottom as seen in FIG. 3D.

In the preferred embodiment of the invention illustrated, an etching system with an oxide:silicon:polysilicon selectivity of >1:1:1 is provided to preferentially etch the protruding oxide regions 314 seen in FIG. 3C into alignment with the silicon and polysilicon regions 310, 316. More preferably the oxide:silicon:polysilicon selectivity is >1.3:1:1, such that only a relatively short etching depth (and a correspondingly short time period) is required to bring the oxide, silicon and polysilicon regions 314, 310, 316 into alignment. As with the above etching steps, the selected etching system preferably exhibits good selectivity with respect to the particular resist used.

Preferred plasma source gases for this etching step are halocarbon species, which may or may not comprise a hydrogen atom. Preferred halocarbon species are of the formula $C_xX_yH_z$, where X is a halogen atom, x is an integer of 1 or more, y is an integer of 1 or more, and z is an integer of zero or more. More preferred are fluorocarbon species of the formula $C_xF_yH_z$, where x, y, and z are defined above. Specific examples include $CF_4$ and $CHF_3$.

Typically, only a very small amount of etching is required to align the polysilicon/silicon regions 310, 316 with the oxide regions 314. Under these circumstances, it may be desirable to extend etch duration, for example, by including a diluent gas with the reactive species in the plasma source gas.

In one preferred embodiment, a plasma source gas containing $CF_4$ and Ar is provided. As a specific example, a DPS etching system such as that described above can be operated within the following parameters: $CF_4$ flow rate: 60–100 sccm, Ar flow rate: 80–160 sccm, pressure: 5–15 mT, source power: 700–1300 W, bias power: 15–35 W. An exemplary flow ratio is $Ar/CF_4$ 1.5:1. (This set of operating parameters provides an oxide:silicon:polysilicon selectivity of about 1.6:1:1). As it is well known in the field of oxide etch, the addition of $CHF_3$ to this mixture can also enhance the etch rate of oxide over silicon/polysilicon. See, e.g., Meijer et al., "Selective plasma etching for contact holes using fluorine-based chemistry with addition of $N_2$", J. Vac. Sci. Technol. B 17(6), November/December 1999, 2644–2647, the entire disclosure of which is hereby incorporated by reference.

The resulting structure can be further processed as required by the application at hand. For example, the resulting structure can be further processed to form a DRAM device using techniques known in the art. See, e.g., U.S. Pat. No. 5,831,301 to Horak et al., the entire disclosure of which is hereby incorporated by reference.

Although various embodiments are specifically illustrated and described herein, it will be appreciated that modifications and variations of the present invention are covered by the above teachings and are within the purview of the appended claims without departing from the spirit and intended scope of the invention. For example, while the preferred embodiments of the present invention are directed to the case where the silicon/polysilicon is initially etched preferentially relative to the oxide, the contrary case is also applicable to the present invention. For example, the oxide can be etched preferentially to the silicon/polysilicon (i.e., an etching system can be used that has an oxide:silicon:polysilicon selectivity of >1:1:1) in the initial trench isolation step, so long as the silicon/polysilicon regions are preferentially etched relative to the oxide regions in the follow-up step (i.e., the follow-up etch has an oxide:silicon:polysilicon selectivity of <1:1:1) to removed the oxide depressions and even up the trench bottom.

All the features disclosed in this specification (including any accompanying claims, abstract and drawings), and/or all of the steps of any method or process so disclosed, may be combined in any combination, except for combinations where at least some of the features and/or steps are mutually exclusive.

Each feature disclosed in this specification (including any accompanying claims, abstract, and drawings), may be replaced by alternative features serving the same equivalent or similar purpose, unless expressly stated otherwise. Thus, unless expressly stated otherwise, each feature disclosed is one example only of a generic series of equivalent or similar features.

What is claimed is:

1. A method of forming a shallow trench within a trench capacitor structure, said method comprising:

providing a trench capacitor structure comprising (a) a silicon substrate having an upper and a lower surface; (b) first and second trenches extending from said upper surface into said silicon substrate; (c) first and second oxide regions lining at least portions of said first and second trenches; and (d) first and second polysilicon regions at least partially filling said oxide lined first and second trenches; and forming a shallow trench from an upper surface of said structure, said shallow trench having a substantially flat trench bottom that forms an interface with portions of said silicon substrate, said first oxide region, said second oxide region, said first polysilicon region and said second polysilicon region, said shallow trench being formed by a process comprising (a) a first plasma etching step having an oxide:silicon:polysilicon selectivity of >1:1:1 and (b) a second plasma etching step having an oxide:silicon:polysilicon selectivity of <1:1:1.

2. The method of claim 1, wherein said first and second plasma etching steps are conducted using plasma source gases that comprise halogen-atom-comprising species.

3. The method of claim 1, wherein said first plasma etching step results in depressions along the trench bottom at the interfaces with said first and second oxide regions, said depressions being from 50 to 300 Angstroms in depth.

4. The method of claim 1, wherein said first and second etching steps are conducted within a decoupled plasma source etching system.

5. A process of forming a DRAM device comprising the method of claim 1.

* * * * *